United States Patent
Kim et al.

(10) Patent No.: US 10,303,029 B2
(45) Date of Patent: May 28, 2019

(54) LIQUID CRYSTAL DISPLAY WITH IN-CELL PHASE DIFFERENCE LAYER

(71) Applicant: SAMSUNG ELECTRONICS CO., LTD., Suwon-si (KR)

(72) Inventors: Beom Seok Kim, Seoul (KR); Sangah Gam, Seoul (KR); Ju Hyun Kim, Anyang-si (KR); Hyun-Seok Choi, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/925,439

(22) Filed: Mar. 19, 2018

(65) Prior Publication Data
US 2019/0113782 A1 Apr. 18, 2019

(30) Foreign Application Priority Data
Oct. 16, 2017 (KR) ........................ 10-2017-0134030

(51) Int. Cl.
*G02F 1/137* (2006.01)
*H01L 27/12* (2006.01)
(Continued)

(52) U.S. Cl.
CPC ............ *G02F 1/137* (2013.01); *G02F 1/1337* (2013.01); *G02F 1/1368* (2013.01);
(Continued)

(58) Field of Classification Search
CPC combination set(s) only.
See application file for complete search history.

(56) References Cited

U.S. PATENT DOCUMENTS 8,796,704 B2 * 8/2014 Hatta .................. H01L 27/3213
257/59
2013/0342793 A1 12/2013 Takeda et al.
(Continued)

FOREIGN PATENT DOCUMENTS

JP 2011075817 4/2011
JP 2015038598 2/2015
(Continued)

*Primary Examiner* — Lauren Nguyen
(74) *Attorney, Agent, or Firm* — Cantor Colburn LLP

(57) ABSTRACT

A liquid crystal display includes a lower substrate and an upper substrate facing each other, a liquid crystal layer disposed between the lower substrate and the upper substrate, a color conversion layer disposed on the liquid crystal layer, a first polarizing layer and a first phase difference layer disposed between the liquid crystal layer and the color conversion layer, and a second polarizing layer and a second phase difference layer disposed between a light source and the lower substrate, wherein the first phase difference layer has a refractive index satisfying Inequality 1 and the second phase difference layer has refractive indexes satisfying Inequality 2.

$$n_{x1} \geq n_{y1} \geq n_{z1} \qquad \text{[Inequality 1]}$$

$$n_{x2} > n_{z2} > n_{y2} \qquad \text{[Inequality 2]}$$

In Inequalities 1 and 2, $n_{x1}$, $n_{x2}$, $n_{y1}$, $n_{y2}$, $n_{z1}$, and $n_{z2}$ are the same in the detailed description.

20 Claims, 11 Drawing Sheets

(51) Int. Cl.
  *G02F 1/1335* (2006.01)
  *G02F 1/1337* (2006.01)
  *G02F 1/1362* (2006.01)
  *G02F 1/1368* (2006.01)
(52) U.S. Cl.
  CPC .. *G02F 1/133512* (2013.01); *G02F 1/133528* (2013.01); *G02F 1/136286* (2013.01); *H01L 27/124* (2013.01); *G02F 1/133514* (2013.01); *G02F 2001/13712* (2013.01); *G02F 2001/133548* (2013.01); *G02F 2201/121* (2013.01); *G02F 2201/123* (2013.01)

(56) References Cited

U.S. PATENT DOCUMENTS

2014/0063418 A1* 3/2014 Zhao ................ G02F 1/133634
  349/96
2015/0331278 A1* 11/2015 Araki ................ G02F 1/133617
  349/61
2016/0131809 A1 5/2016 Takeda et al.
2016/0291225 A1 10/2016 Sato et al.
2016/0299371 A1 10/2016 Kim et al.
2017/0031074 A1 2/2017 Kong et al.

FOREIGN PATENT DOCUMENTS

| JP | 5915533 | 5/2016 |
| JP | 6027909 | 11/2016 |
| KR | 101065181 | 9/2011 |
| KR | 101450687 | 10/2014 |
| KR | 1020160089898 | 7/2016 |
| KR | 101662106 | 10/2016 |
| KR | 1020160120837 | 10/2016 |
| KR | 1020170001163 | 1/2017 |
| KR | 101705942 | 2/2017 |
| KR | 1020170013143 | 2/2017 |

* cited by examiner

LIQUID CRYSTAL DISPLAY WITH IN-CELL PHASE DIFFERENCE LAYER

CROSS-REFERENCE TO RELATED APPLICATION

This application claims priority to Korean Patent Application No. 10-2017-0134030, filed on Oct. 16, 2017, and all the benefits accruing therefrom under 35 U.S.C. § 119, the content of which in its entirety is herein incorporated by reference.

BACKGROUND

1. Field

Embodiments of a liquid crystal display are disclosed.

2. Description of the Related Art

A liquid crystal display ("LCD") is one of the most widely used types of a flat panel display. The LCD generally includes two display panels formed with at least two field generating electrodes and a liquid crystal layer interposed therebetween, and liquid crystal molecules are rotated depending upon an electric field formed between the field generating electrodes to thereby vary light transmittance to display an image.

The LCD displays color by combining light from a light source with a color filter. However, a color filter absorbs a lot of light emitted from a light source, and thus lowers photo-efficiency.

SUMMARY

Recently, research on a photo-luminescent liquid crystal display ("LCD") displaying a color by using a light emitting element instead of a color filter has been made.

However, the photo-luminescent LCD may rarely adopt a conventional structure of disposing a polarizing plate on the light emitting element due to scattering characteristics of the light emitting element and the like. Accordingly, the photo-luminescent LCD may show a deteriorated contrast ratio and thus deteriorated display characteristics compared with an LCD using a color filter.

An embodiment provides an LCD capable of increasing a contrast ratio of a photo-luminescent LCD and thus improving display characteristics.

According to an embodiment, an LCD includes a lower substrate and an upper substrate facing each other, a liquid crystal layer between the lower substrate and the upper substrate, a color conversion layer on the liquid crystal layer, a first polarizing layer and a first phase difference layer between the liquid crystal layer and the color conversion layer, and a second polarizing layer and a second phase difference layer between a light source and the lower substrate, wherein the first phase difference layer has a refractive index satisfying Inequality 1 and the second phase difference layer has refractive indexes satisfying Inequality 2.

$$n_{x1} \geq n_{y1} \geq n_{z1} \qquad \text{[Inequality 1]}$$

In Inequality 1,
$n_{x1}$ denotes a refractive index at a slow axis of the first phase difference layer,
$n_{y1}$ denotes a refractive index at a fast axis of the first phase difference layer, and
$n_{z1}$ denotes a refractive index of the first phase difference layer in a direction perpendicular to the slow axis and the fast axis thereof, $$n_{x2} > n_{z2} > n_{y2} \qquad \text{Inequality 2}$$

In Inequality 2,
$n_{x2}$ denotes a refractive index at a slow axis of the second phase difference layer,
$n_{y2}$ denotes a refractive index at a fast axis of the second phase difference layer, and
$n_{z2}$ denotes a refractive index of the second phase difference layer in a direction perpendicular to the slow axis and the fast axis thereof.

In an embodiment, the first phase difference layer may have a retardation satisfying Inequality 3.

$$230 \text{ nm} \leq R_{th1}(450 \text{ nm}) \leq 370 \text{ nm} \qquad \text{Inequality 3}$$

In Inequality 3, $R_{th1}(450 \text{ nm})$ denotes a thickness direction retardation of the first phase difference layer at a wavelength of 450 nanometers (nm).

In an embodiment, the first phase difference layer may have a retardation satisfying Inequality 4.

$$0 \text{ nm} \leq R_{in1}(450 \text{ nm}) \leq 20 \text{ nm} \qquad \text{Inequality 4}$$

In Inequality 4, $R_{in1}(450 \text{ nm})$ denotes an in-plane retardation of the first phase difference layer at the wavelength of 450 nm.

In an embodiment, the second phase difference layer may have a retardation satisfying Inequality 5.

$$110 \text{ nm} \leq R_{in2}(450 \text{ nm}) \leq 330 \text{ nm} \qquad \text{Inequality 5}$$

In Inequality 5, $R_{in2}(450 \text{ nm})$ denotes an in-plane retardation of the second phase difference layer at a wavelength of 450 nm.

In an embodiment, the second phase difference layer may have a retardation satisfying Inequality 6.

$$-60 \text{ nm} \leq R_{th2}(450 \text{ nm}) \leq 65 \text{ nm} \qquad \text{Inequality 6}$$

In Inequality 6, $R_{th2}(450 \text{ nm})$ denotes a thickness direction retardation of the second phase difference layer at a wavelength of 450 nm.

In an embodiment, the second phase difference layer may have a retardation satisfying Inequality 7.

$$-0.25 \leq R_{th2}(450 \text{ nm})/R_{in2}(450 \text{ nm}) \leq 0.25 \qquad \text{Inequality 7}$$

In Inequality 7,
$R_{in2}(450 \text{ nm})$ denotes an in-plane retardation of the second phase difference layer at a wavelength of 450 nm, and
$R_{th2}(450 \text{ nm})$ denotes a thickness direction retardation of the second phase difference layer at the wavelength of 450 nm.

In an embodiment, the first phase difference layer may be disposed between the liquid crystal layer and the first polarizing layer.

In an embodiment, the second phase difference layer may be between the second polarizing layer and the lower substrate.

In an embodiment, the color conversion layer may include a light emitting element which receives a first visible light from the light source and emits a second visible light.

In an embodiment, the first visible light may be blue light and the second visible light may be one of blue light, green light, red light, and a combination thereof.

In an embodiment, the light emitting element may include at least one of a quantum dot and a phosphor.

In an embodiment, the liquid crystal layer may have negative dielectric anisotropy.

In an embodiment, the thickness direction retardation of the liquid crystal layer may have $-360$ nm$\leq R_{th,cell} \leq -250$ nm.

According to another embodiment, an LCD includes a first phase difference layer and a second phase difference layer, wherein one of the first phase difference layer and the second phase difference layer is inside an LCD panel and the other of the first phase difference layer and the second phase difference layer is outside of the LCD panel, the first phase difference layer has a refractive index satisfying Inequality 1, and the second phase difference layer has refractive indexes satisfying Inequality 2.

$$n_{x1} \geq n_{y1} \geq n_{z1} \quad \text{[Inequality 1]}$$

In Inequality 1, $n_{x1}$ denotes a refractive index at a slow axis of the first phase difference layer, $n_{y1}$ denotes a refractive index at a fast axis of the first phase difference layer, and $n_{z1}$ denotes a refractive index of the first phase difference layer in a direction perpendicular to the slow axis and the fast axis thereof.

$$n_{x2} > n_{z2} > n_{y2} \quad \text{Inequality 2}$$

In Inequality 2, $n_{x2}$ denotes a refractive index at a slow axis of the second phase difference layer, $n_{y2}$ denotes a refractive index at a fast axis of the second phase difference layer, and $n_{z2}$ denotes a refractive index of the second phase difference layer in a direction perpendicular to the slow axis and the fast axis thereof.

In an embodiment, the first phase difference layer may have a retardation satisfying Inequality 3 and the second phase difference layer may have a retardation satisfying Inequality 5.

$$230 \text{ nm} \leq R_{th1}(450 \text{ nm}) \leq 370 \text{ nm} \quad \text{Inequality 3}$$

$$110 \text{ nm} \leq R_{in2}(450 \text{ nm}) \leq 330 \text{ nm} \quad \text{Inequality 5}$$

In Inequality 3 or 5, $R_{th1}(450 \text{ nm})$ denotes a thickness direction retardation of the first phase difference layer at a wavelength of 450 nm, and $R_{in2}(450 \text{ nm})$ denotes an in-plane retardation of the second phase difference layer at the wavelength of 450 nm.

In an embodiment, the second phase difference layer may have a retardation satisfying Inequality 7.

$$-0.25 \leq R_{th2}(450 \text{ nm})/R_{in2}(450 \text{ nm}) \leq 0.25 \quad \text{Inequality 7}$$

In Inequality 7, $R_{in2}(450 \text{ nm})$ denotes an in-plane retardation of the second phase difference layer at a wavelength of 450 nm, and $R_{th2}(450 \text{ nm})$ denotes a thickness direction retardation of the second phase difference layer at the wavelength of 450 nm.

In an embodiment, the LCD panel may include a lower substrate and an upper substrate facing each other, a liquid crystal layer between the lower substrate and the upper substrate, and a color conversion layer on the liquid crystal layer and including a light emitting element.

In an embodiment, the first phase difference layer may be under the color conversion layer in the LCD panel.

In an embodiment, the LCD may further include a first polarizing layer between the first phase difference layer and the color conversion layer.

In an embodiment, the second phase difference layer may be disposed outside the LCD panel and the LCD may further include a second polarizing layer on the second phase difference layer.

In an embodiment, a contrast ratio of the LCD may be increased and thus display characteristics may be improved.

BRIEF DESCRIPTION OF THE DRAWINGS

The above and other embodiments, advantages and features of this disclosure will become more apparent by describing in further detail embodiments thereof with reference to the accompanying drawings, in which.

DETAILED DESCRIPTION

Figure 1:
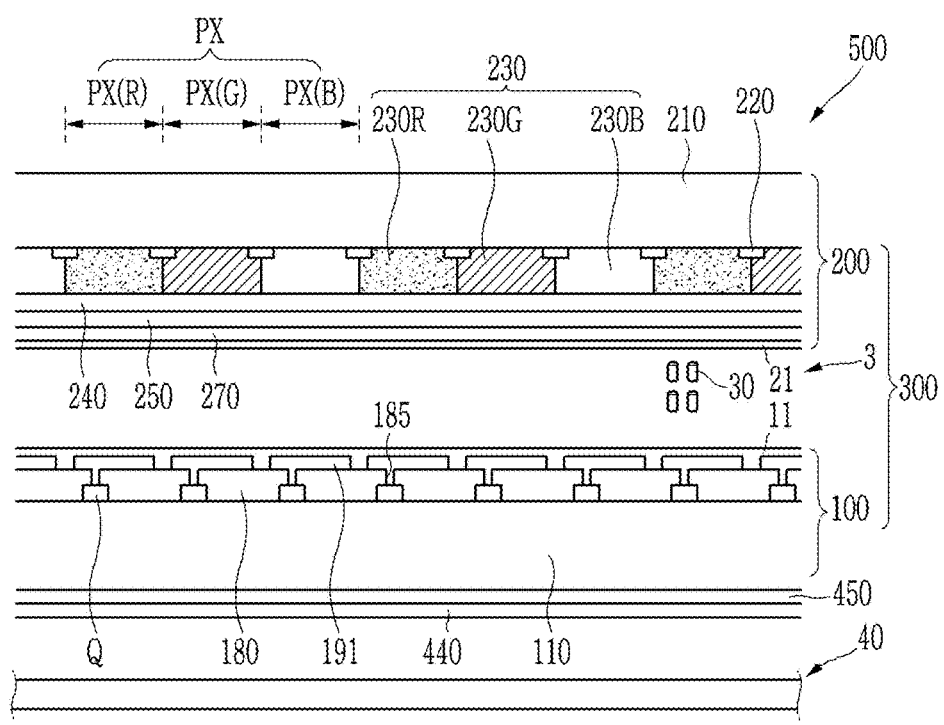
FIG. 1 is a schematic cross-sectional view of an embodiment of a liquid crystal display ("LCD")

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a schematic cross-sectional view of a liquid crystal display ("LCD") according to an embodiment.

Referring to FIG. 1, an LCD 500 according to an embodiment includes a light source 40, an LCD panel 300, a lower polarizing layer 440, and a lower phase difference layer 450.

In an embodiment, the light source 40 may be a planar light source, a dot light source, or a line light source that supplies light with the LCD panel 300, and may be, for example, disposed in form of an edge-type or a direct type. The light source 40 may include a light emitting region including a light emitting element, a reflector disposed under the light emitting region and reflecting light emitted from the light emitting region, a light guide that supplies the light emitted from the light emitting region toward an LCD panel and/or at least one optical sheet disposed on the light guide, but is not limited thereto.

In an embodiment, the light emitting element may be, for example, a fluorescent lamp or a light emitting diode ("LED"), and for example, may supply light in a visible ray region (hereinafter, referred to as 'visible light'), for example, blue light having high energy.

The LCD panel 300 includes a lower panel 100 disposed on the light source 40, a upper panel 200 facing the lower panel 100, and a liquid crystal layer 3 disposed between the lower panel 100 and the upper panel 200.

The lower panel 100 includes a lower substrate 110, a plurality of wires (not shown), a thin film transistor ("TFT") Q, a pixel electrode 191, and an alignment layer 11.

In an embodiment, the lower substrate 110 may be, for example, an insulation substrate such as a glass substrate or a polymer substrate, and the polymer substrate may include, for example, polyethylene terephthalate, polyethylene naphthalate, polycarbonate, polyacrylate, polyimide, or a combination thereof, but is not limited thereto.

A plurality of gate lines (not shown) that supplies a gate signal and a plurality of data lines (not shown) that supplies a data signal may be provided while crossing each other on the lower substrate 110, and a plurality of pixels PX is arranged in a form of a matrix defined by the gate lines and the data lines. In an embodiment, the plurality of pixels PX may include a red pixel PX(R), a green pixel PX(G) and a blue pixel PX(B).

A plurality of TFTs Q is disposed on the lower substrate 110. The TFTs Q may include a gate electrode (not shown) connected with the gate lines, a semiconductor (not shown) overlapping with the gate electrode, a gate insulating layer (not shown) disposed between the gate electrode and the semiconductor, a source electrode (not shown) connected with the data lines, and a source electrode and a drain electrode (not shown) facing the same in the center of the semiconductor. In FIG. 1, each pixel PX includes one TFT Q, but is not limited thereto, and two or more TFTs may be disposed.

A protective layer 180 is disposed on the TFTs Q, and a contact hole 185 exposing the TFTs Q is defined in the protective layer 180.

A pixel electrode 191 is disposed on the protective layer 180. In an embodiment, the pixel electrode 191 may include a transparent conductor such as indium tin oxide ("ITO") or indium zinc oxide ("IZO"), and is electrically connected with the TFT Q through the contact hole 185. The pixel electrode 191 may have a predetermined pattern.

An alignment layer 11 is disposed on the pixel electrode 191.

The upper panel 200 includes an upper substrate 210, a color conversion layer 230, an upper polarizing layer 240, an upper phase difference layer 250, a common electrode 270, and an alignment layer 21.

In an embodiment, the upper substrate 210 may be, for example, an insulation substrate such as a glass substrate or a polymer substrate, and the polymer substrate may include, for example, polyethylene terephthalate, polyethylene naphthalate, polycarbonate, polyacrylate, polyimide, or a combination thereof, but is not limited thereto.

A light blocking member 220 that is referred to as a black matrix is disposed on one surface of the upper substrate 210. The light blocking member 220 may block light leakage between the pixel electrodes 191.

In addition, a color conversion layer 230 is disposed on one surface of the upper substrate 210. The color conversion layer 230 receives light in a predetermined wavelength region and emits the same light or light in a different wavelength region to display colors. The color conversion layer 230 includes a photo-luminescent material that is stimulated by light and emits light by itself, that is a light emitting element. In an embodiment, the light emitting element may be, for example, at least one of a quantum dot and a phosphor.

In an embodiment, the light emitting element may emit light in the same wavelength region received from the light source 40 or light in a longer wavelength region, for example. In an embodiment, when the light source 40 supplies blue light, the light emitting element may emit blue light in the same wavelength region or emit light in a longer wavelength region than blue light, for example, red light or green light. In an embodiment, the light emitting element may emit light by combining at least two of blue light, red light, and green light.

In this way, high photo-conversion efficiency and low power consumption may be realized by including the color conversion layer 230 including a light emitting element. In addition, the color conversion layer 230 including the light emitting element may substantially reduce a light loss according to the absorption and thus increase photo-efficiency compared with a conventional color filter including a dye and/or a pigment and thus absorbing a considerable dose of light emitted from the light source 40 and showing low photo-efficiency. In addition, color purity may be increased by an inherent luminous color of the light emitting element. Furthermore, the light emitting element emits light scattering in all directions and may improve viewing angle characteristics.

FIG. 1 shows a red conversion layer 230R including a red light emitting element emitting red light, a green conversion layer 230G including a green light emitting element emitting green light, and a blue conversion layer 230B including a blue light emitting element emitting blue light, but the present invention is not limited thereto. In an embodiment, the red conversion layer 230R may emit light in a wavelength region ranging from greater than about 590 nanometers (nm) to less than or equal to about 700 nm, the green conversion layer 230G may emit light in a wavelength region ranging from about 510 nm to about 590 nm, and the blue conversion layer 230B may emit light in a wavelength region ranging from greater than or equal to about 380 nm to less than about 510 nm, for example. In an embodiment, the light emitting element may be a light emitting element emitting cyan light, a light emitting element emitting magenta light, and/or a light emitting element emitting yellow light or additionally include these light emitting elements. In an embodiment, when the light source 40 supplies blue light, the blue conversion layer 230B passes the light supplied from the light source 40 without a separate light emitting element as it is and thus display blue, and herein, the blue conversion layer 230B may be empty or include a transparent insulator, for example.

The light emitting element may be, for example, at least one of a phosphor and a quantum dot.

In an embodiment, the red conversion layer 230R may include a red phosphor, for example, at least one of $Y_2O_2S$:Eu, $YVO_4$:Eu,Bi, $Y_2O_2S$:Eu,Bi, SrS:Eu, (Ca,Sr)S:Eu, $SrY_2S_4$:Eu, $CaLa_2S_4$:Ce, $(Sr,Ca,Ba)_3SiO_5$:Eu, $(Sr,Ca,Ba)_2SiSN_8$:Eu, and $(Ca,Sr)_2AlSiN_3$:Eu. In an embodiment, the green conversion layer 230G may include a green phosphor, for example, at least one of $YBO_3$:Ce,Tb, $BaMgAl_{10}O_{17}$:Eu,Mn, $(Sr,Ca,Ba)(Al,Ga)_2S_4$:Eu, ZnS:Cu,Al $Ca_8MgSiO_{44}Cl_2$:Eu,Mn, $Ba_2SiO_4$:Eu, $(Ba,Sr)_2SiO_4$:Eu, $Ba_2(Mg,Zn)Si_2O_7$:Eu, $(Ba,Sr)Al_2O_4$:Eu, $Sr_2Si_3O_8.2SrCl_2$:Eu, $(Sr,Ca,Ba,Mg)P_2O_7N_8$:Eu, Mn, $(Sr,Ca,Ba,Mg)_3P_2O_8$:Eu,Mn, $Ca_3Sc_2Si_3O_{12}$:Ce, $CaSc_2O_4$:Ce, b-SiAlON:Eu, $Ln_2Si_3O_3N_4$:Tb, and $(Sr,Ca,Ba)Si_2O_2N_2$:Eu.

In an embodiment, the red conversion layer 230 may include a quantum dot. The quantum dot may be a semiconductor nanocrystal in a general concept, and may have various shapes, for example, an isotropic semiconductor nanocrystal, a quantum rod, and a quantum plate. Herein, the quantum rod may indicate a quantum dot having an aspect ratio greater than about 1, for example, an aspect ratio greater than or equal to about 2, greater than or equal to about 3, or greater than or equal to about 5. In an embodiment, the quantum rod may have an aspect ratio of less than or equal to about 50, of less than or equal to about 30, or of less than or equal to about 20. In an embodiment, the quantum dot may have, for example, a particle diameter (an average largest particle diameter for a non-spherical shape) of about 1 nm to about 100 nm, for example, about 1 nm to about 80 nm, for example, about 1 nm to about 50 nm, for example, about 1 nm to about 20 nm.

The quantum dot may control a light emitting wavelength by changing a size and/or a composition. In an embodiment, the quantum dot may include a Group II-VI compound, a Group III-V compound, a Group IV-VI compound, a Group IV compound, or a combination thereof. The Group II-VI compound may include, for example, a binary element compound including CdSe, CdTe, ZnS, ZnSe, ZnTe, ZnO, HgS, HgSe, HgTe, MgSe, MgS, and a combination thereof; a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound including HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. The Group III-V compound may include a binary element compound including GaN, GaP, GaAs, GaSb, AlN, AlP, AlAs, AlSb, InN, InP, InAs, InSb, and a combination thereof; a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof; and a quaternary element compound including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group IV-VI compound may include a binary element compound including SnS, SnSe, SnTe, PbS, PbSe, PbTe, and a combination thereof; a ternary element compound including SnSeS, SnSeTe, SnSTe, PbSeS, PbSeTe, PbSTe, SnPbS, SnPbSe, SnPbTe, and a combination thereof; and a quaternary element compound including SnPbSSe, SnPbSeTe, SnPbSTe, and a combination thereof. The Group IV compound may include a single-element compound including Si, Ge, and a combination thereof; and a binary element compound including SiC, SiGe, and a combination thereof.

The quantum dot may include the binary element compound, the ternary element compound, or the quaternary element compound in a substantially uniform concentration or partially different concentration distributions. The quantum dot may have a core-shell structure wherein one quantum dot surrounds another quantum dot. In an embodiment, the core and the shell of the quantum dot may have an interface, and an element of at least one of the core or the shell in the interface may have a concentration gradient wherein the concentration of the element(s) of the shell decreases toward the core, for example. In an embodiment, a material composition of the shell of the quantum dot has a higher energy bandgap than a material composition of the core of the quantum dot, and thereby the quantum dot may exhibit a quantum confinement effect, for example. The quantum dot may have one core of a quantum dot and multi-shells surrounding the core. The multi-shell structure has at least two shells wherein each shell may be a single composition, an alloy, or the one having a concentration gradient. In an embodiment, a shell of a multi-shell that is far from the core may have a higher energy bandgap than a shell that is near to the core, and thereby the quantum dot may exhibit a quantum confinement effect, for example.

In an embodiment, the quantum dot may have a quantum yield greater than or equal to about 10 percent (%), for example, greater than or equal to about 30%, greater than or equal to about 50%, greater than or equal to about 60%, greater than or equal to about 70%, or greater than or equal to about 90%, but is not limited thereto. The quantum dot has a relatively narrower spectrum. In an embodiment, the quantum dot may have a full width at half maximum ("FWHM") of a light emitting wavelength spectrum of less than or equal to about 45 nm, for example, less than or equal to about 40 nm, or less than or equal to about 30 nm.

The quantum dot may be included in the color conversion layer 230 in a form of a quantum dot-polymer composite wherein the quantum dot is dispersed in the polymer. The polymer may act as a matrix of the quantum dot-polymer composite, and the quantum dot is not particularly limited if it does not quench the quantum dot. In an embodiment, the polymer may include a transparent polymer, for example, polyvinylpyrrolidone, polystyrene, polyethylene, polypropylene, poly(methyl)acrylate, polymethylmethacrylate, polybutylmethacrylate ("PBMA"), a copolymer thereof, or a combination thereof, but is not limited thereto. The quantum dot-polymer composite may have one layer or a multi-layer.

The upper polarizing layer 240 is disposed on one surface of the color conversion layer 230.

The upper polarizing layer 240 may be an in-cell polarizing layer inside the LCD panel 300 and may be disposed on a lower whole surface of the color conversion layer 230. The upper polarizing layer 240 may be disposed under the color conversion layer 230 and supplies polarized light with the color conversion layer 230.

In this way, since the upper polarizing layer 240 is disposed beneath the color conversion layer 230, but a separate polarizing plate attached outside of the LCD panel 300 is not disposed, light emitted from the light emitting element of the color conversion layer 230 receives no influence by the polarizing plate outside of the LCD panel 300, and resultantly, a contrast ratio may be improved.

Specifically, the light emitting element of the color conversion layer 230 emits scattered light that polarizing light is broken, and accordingly, when a polarizing plate is disposed on the color conversion layer 230, that is, where the scattered light passes, black luminance may be substantially increased, and thus a contrast ratio may be lowered. In addition, an effect of improving a viewing angle of an LCD may not be hindered by the scattered light emitted from the light emitting element of the color conversion layer 230 but maintained.

Accordingly, an in-cell polarizing layer used as the upper polarizing layer 240 may prevent discoloring or image distortion due to an influence of a polarizing plate attached to an outside of an LCD panel 300 on light emitted from the light emitting element but maintain inherent light emitting characteristics of the light emitting element and thus secure high color purity but reduce a light loss. In addition, the in-cell polarizing layer is a thin film having a thickness less than or equal to about 1 µm, and thus may reduce a thickness of an LCD.

The upper polarizing layer 240 may be a linear polarizer that converts light emitted from the light source 40 and passing through the liquid crystal layer 3 into linear polarized light.

In an embodiment, the upper polarizing layer 240 may include, for example, elongated polyvinyl alcohol ("PVA") according to a method of, for example, elongating a polyvinyl alcohol film, adsorbing iodine or a dichroic dye thereto, and borating and washing the same.

In an embodiment, the upper polarizing layer 240 may be a polarizing film prepared, for example, by mixing a polymer and a dichroic dye and melt blending the polymer with the dichroic dye to melt them at a temperature above the melting point of the polymer. In an embodiment, the polymer may include a hydrophobic polymer, for example, polyolefin.

In an embodiment, the upper polarizing layer 240 may be a wire grid polarizer. The wire grid polarizer has a structure that a plurality of metal wire is aligned in one direction, and accordingly, when incident light passes the wire grid polarizer, light parallel to a metal wire is absorbed or reflected, but light perpendicular therewith is transmitted and may form linear polarized light. Herein, the linear polarized light may be more efficiently provided when a wavelength of light is wider than a gap between the metal wires. The wire grid polarizer may be appropriately applied as the in-cell polarizing layer and also, is thin and thus may realize a thin LCD 500.

The upper phase difference layer 250 is disposed on one surface of the upper polarizing layer 240.

The upper phase difference layer 250 may be an in-cell phase difference layer inside the LCD panel 300. In an embodiment, the upper phase difference layer 250 may contact the upper polarizing layer 240, for example. In an embodiment, the upper phase difference layer 250 may be spaced apart from the upper polarizing layer 240 by disposing another layer therebetween, for example, an insulation layer (not shown) such as silicon oxide and nitrogen oxide.

When the upper phase difference layer 250 is combined with a lower phase difference layer 450 disposed outside of a lower panel 100 to adjust a retardation, a light leakage at the side before light reaches the color conversion layer 230 in a black mode may be reduced or prevented, an unnecessary light emission of the color conversion layer 230 in the black mode may be reduced, and accordingly, black luminance may be decreased, and thus a contrast ratio may be improved.

The upper phase difference layer 250 may include a heat resistant polymer, a heat resistant liquid crystal, or a combination thereof. In an embodiment, the heat resistant polymer may include, for example, polymers having a glass transition temperature (Tg) greater than or equal to about 150 degrees Celsius (° C.), and may include, for example, polyimide, polyamic acid, polyamide, polycarbonate, cycloolefin, or a combination thereof, but is not limited thereto. In an embodiment, the heat resistant polymer may have a glass transition temperature (Tg) greater than or equal to about 180° C., for example, greater than or equal to about 200° C., greater than or equal to about 220° C., or greater than or equal to about 230° C. In an embodiment, the upper phase difference layer 250 may include a liquid crystal layer made of liquid crystals having positive or negative birefringence and may further include an alignment layer on one surface of the liquid crystal layer, for example.

In an embodiment, the upper phase difference layer 250 may be provided with a predetermined retardation by elongating a film made of a heat resistant polymer in a uniaxial or biaxial direction, for example. In an embodiment, the upper phase difference layer 250 may be endowed with a predetermined retardation to induce linear or surface alignment of a heat resistant polymer or a heat resistant liquid crystal during the drying, when the heat resistant polymer or the heat resistant liquid crystal is prepared as a solution and then, coated and dried, for example.

The common electrode 270 is disposed on one surface of the upper phase difference layer 250. The common electrode 270 may include, for example, a transparent conductor such as ITO or IZO and disposed on a whole surface of the upper phase difference layer 250. The common electrode 270 has a predetermined pattern.

The alignment layer 21 is coated on one surface of the common electrode 270.

The liquid crystal layer 3 including a plurality of liquid crystals 30 is disposed between the lower panel 100 and the upper panel 200. The liquid crystal 30 may have positive or negative dielectric anisotropy. In an embodiment, the liquid crystal 30 may have negative dielectric anisotropy, for example. In an embodiment, the liquid crystal 30 may be aligned in a substantially vertical direction to the surfaces of the substrates 110 and 210 when an electric field is not applied to the pixel electrode 191 and the common electrode 270, for example. Therefore, the LCD 500 may realize a vertical alignment LCD. In an embodiment, the liquid crystal layer 30 may have a thickness direction retardation satisfying a range of about −360 nm≤$R_{th,cell}$≤about −250 nm, for example.

The lower polarizing layer 440 is attached to an outside of the lower panel 100. The lower polarizing layer 440 may be a linear polarizer and polarizes light supplied from the light source 40 and supplies polarized light with the liquid crystal layer 3.

In an embodiment, the lower polarizing layer 440 may include, for example, PVA according to a method of, for example, elongating a polyvinyl alcohol film, adsorbing iodine or a dichroic dye thereto, and treating it with a borate and washing the same.

In an embodiment, the lower polarizing layer 440 may be a polarizing film prepared, for example, by mixing a polymer and a dichroic dye and melt blending the polymer with the dichroic dye to melt them at a temperature above the melting point of the polymer. In an embodiment, the polymer may be a hydrophobic polymer, for example, polyolefin.

In an embodiment, the lower polarizing layer 240 may be a wire grid polarizer, for example. The wire grid polarizer is combined with the upper polarizing layer 240 to realize a thin LCD 500.

The lower phase difference layer 450 may be attached to an outside of the lower panel 100 and may be disposed between the lower panel 100 and the lower polarizing layer 440.

As described above, a contrast ratio may be improved by combining the upper phase difference layer 250 with the lower phase difference layer 450 to adjust a retardation, and thus reducing or preventing the light leakage at the side before light reaches the color conversion layer 230 in a black mode, and accordingly, reducing the unnecessary light emission of the color conversion layer 230 in a black mode and thus decreasing black luminance. The combination of the upper phase difference layer 250 with the lower phase difference layer 450 may be variously designed to reduce light leakage and increase a contrast ratio.

In an embodiment, the upper phase difference layer 250 may have a refractive index satisfying Inequality 1.

$$n_{x1} \geq n_{y1} \geq n_{z1} \qquad \text{<Inequality 1>}$$

In Inequality 1, $n_{x1}$ denotes a refractive index of the upper phase difference layer 250 in a direction having a highest in-plane refractive index (hereinafter, referred to as a slow axis), $n_{y1}$ denotes a refractive index of the upper phase difference layer 250 in a direction having a lowest in-plane refractive index (hereinafter, referred to as a fast axis), and $n_{z1}$ denotes a refractive index of the upper phase difference layer 250 in a direction perpendicular to the slow axis and fast axis.

In Inequality 1, when $n_{x1}$ and $n_{y1}$ satisfy $n_{x1} > n_{y1}$, for example, the refractive index of $n_{x1}$ may be greater than the refractive index of $n_{y1}$ by about 0.02 or less, for example, by about 0.01 or less. By satisfying the ranges, the upper phase difference layer 250 may have a substantial in-plane isotropy.

When the upper phase difference layer 250 has the refractive index satisfying Inequality 1, a compensation function to reduce a viewing angle dependency may be performed.

In an embodiment, the upper phase difference layer 250 may, for example, have a refractive index satisfying Inequality 1-1.

$$n_{x1} = n_{y1} > n_{z1} \qquad \text{<Inequality 1-1>}$$

Retardation of the upper phase difference layer 250 may be expressed as in-plane retardation ($R_{in1}$) and thickness direction retardation ($R_{th1}$). The in-plane retardation ($R_{in1}$) of the upper phase difference layer 250 is retardation generated in an in-plane direction of the upper phase difference layer 250 and may be expressed by $R_{in1} = (n_{x1} - n_{y1})d_1$. Herein, $d_1$ denotes a thickness of the upper phase difference layer 250. The thickness direction retardation ($R_{th1}$) of the upper phase difference layer 250 is retardation generated in a thickness direction of the upper phase difference layer 250 and may be expressed by $R_{th1} = \{[(n_{x1} + n_{y1})/2] - n_{z1}\}d_1$.

The upper phase difference layer 250 may have in-plane retardation and thickness direction retardation within a predetermined range by changing the $n_{x1}$, $n_{y1}$, $n_{z1}$, and/or thickness ($d_1$).

In an embodiment, the upper phase difference layer 250 satisfying Inequality 1 may, for example, satisfy a thickness direction retardation ($R_{th1}$) of Inequality 3.

$$230 \text{ nm} \leq R_{th1}(450 \text{ nm}) \leq 370 \text{ nm} \qquad \text{<Inequality 3>}$$

In Inequality 3, $R_{th1}$(450 nm) denotes a thickness direction retardation of the upper phase difference layer at a wavelength of 450 nm.

Herein, the retardation is described based on 450 nm, but when a light emitting wavelength of the light source is changed, the reference wavelength may be changed and retardation may be also changed. In an embodiment, the retardation and the reference wavelength may be set to satisfy the relations: $0.51 \leq \Delta_{BL}$(nm)$\leq R_{th}(\Delta_{BL}) \leq 0.82 \times \Delta_{BL}$ (nm) ($\Delta_{BL}$ (nm) is a maximum light emitting wavelength of a light source), for example, $0.53 \times \Delta_{BL}$ (nm)$\leq R_{th}(\Delta_{BL}) \leq 0.80 \times \Delta_{BL}$ (nm), $00.55 \times \Delta_{BL}$ (nm)$\leq R_{th}(\Delta_{BL}) \leq 0.78 \times \Delta_{BL}$ (nm), or $0.60 \times \Delta_{BL}$ (nm)$\leq R_{th}(\Delta_{BL}) \leq 0.74 \times \Delta_{BL}$ (nm), but is not limited thereto.

The upper phase difference layer 250 may, for example, have a thickness direction retardation satisfying Inequality 3a.

$$240 \text{ nm} \leq R_{th1}(450 \text{ nm}) \leq 360 \text{ nm} \qquad \text{<Inequality 3a>}$$

The upper phase difference layer 250 may, for example, have a thickness direction retardation satisfying Inequality 3b.

$$250 \text{ nm} \leq R_{th1}(450 \text{ nm}) \leq 350 \text{ nm} \qquad \text{<Inequality 3b>}$$

The upper phase difference layer 250 may, for example, have a thickness direction retardation satisfying Inequality 3c.

$$270 \text{ nm} \leq R_{th1}(450 \text{ nm}) \leq 330 \text{ nm} \qquad \text{<Inequality 3c>}$$

The upper phase difference layer 250 satisfies a thickness direction retardation within the range and accordingly, may decrease or offset the thickness direction retardation, thus reduce viewing angle dependency, and resultantly, effectively perform a compensation function.

In an embodiment, the upper phase difference layer 250 satisfying Inequality 1 may, for example, have an in-plane retardation ($R_{in1}$) satisfying Inequality 4.

$$0 \text{ nm} \leq R_{in1}(450 \text{ nm}) \leq 20 \text{ nm} \qquad \text{<Inequality 4>}$$

In Inequality 4, $R_{in1}$(450 nm) denotes an in-plane retardation of the upper phase difference layer at a wavelength of 450 nm.

The upper phase difference layer 250 may, for example, have an in-plane retardation satisfying Inequality 4a.

$$0 \text{ nm} \leq R_{in1}(450 \text{ nm}) \leq 10 \text{ nm} \qquad \text{<Inequality 4a>}$$

The upper phase difference layer 250 may, for example, have an in-plane retardation satisfying Inequality 4b.

$$0 \text{ nm} \leq R_{in1}(450 \text{ nm}) \leq 5 \text{ nm} \qquad \text{<Inequality 4b>}$$

The upper phase difference layer 250 may, for example, have an in-plane retardation satisfying Inequality 4c.

$$0 \text{ nm} \leq R_{in1}(450 \text{ nm}) \leq 2 \text{ nm} \qquad \text{<Inequality 4c>}$$

When the upper phase difference layer 250 satisfies Inequality 1, the lower phase difference layer 450 may, for example, have a refractive index satisfying Inequality 2.

$$n_{x2} > n_{z2} > n_{y2} \qquad \text{<Inequality 2>}$$

In Inequality 2, $n_{x2}$ denotes a refractive index at a slow axis of the lower phase difference layer 450, $n_{y2}$ denotes a refractive index at a fast axis of the lower phase difference layer 450, and $n_{z2}$ denotes a refractive index of the lower phase difference layer 450 in a direction perpendicular to the slow axis and fast axis.

The upper and lower phase difference layers 250 and 450 having the above refractive indexes are combined and thus perform an effective compensation function and accordingly, may effectively decrease a light leakage.

Retardation of the lower phase difference layer 450 may be expressed as an in-plane retardation ($R_{in2}$) and a thickness direction retardation ($R_{th2}$). The in-plane retardation ($R_{in1}$) of the lower phase difference layer 450 is retardation generated in an in-plane direction of the lower phase difference layer 450 and may be expressed by $R_{in2}=(n_{x2}-n_{y2})d_2$. The thickness direction retardation ($R_{th2}$) of the lower phase difference layer 450 is retardation generated in a thickness direction of the lower phase difference layer 450 and may be expressed by $R_{th2}=\{[(n_{x2}+n_{y2})/2]-n_{z2}\}d_2$. Herein, $d_2$ denotes a thickness of the lower phase difference layer 450.

The lower phase difference layer 450 may have an in-plane retardation and a thickness direction retardation within a predetermined range by changing the $n_{x2}$, $n_{y2}$, $n_{z2}$ and/or thickness ($d_2$).

The lower phase difference layer 450 satisfying Inequality 2 may, for example, have an in-plane retardation satisfying Inequality 5.

$$110 \text{ nm} \leq R_{in2}(450 \text{ nm}) \leq 330 \text{ nm} \qquad \text{Inequality 5}$$

In Inequality 5, $R_{in2}$(450 nm) denotes an in-plane retardation of the lower phase difference layer 450 at a wavelength of 450 nm.

As the in-plane retardation of the lower phase difference layer 450 satisfies Inequality 5, the retardations of the upper phase difference layer 250 and the lower phase difference layer 450 may be combined to effectively reduce viewing angle dependency and further increase a compensation function.

The lower phase difference layer 450 may, for example, have an in-plane retardation satisfying Inequality 5a.

$$120 \text{ nm} \leq R_{in2}(450 \text{ nm}) \leq 320 \text{ nm} \qquad \text{<Inequality 5a>}$$

The lower phase difference layer 450 may, for example, have an in-plane retardation satisfying Inequality 5b.

$$150 \text{ nm} \leq R_{in2}(450 \text{ nm}) \leq 300 \text{ nm} \qquad \text{<Inequality 5b>}$$

The lower phase difference layer 450 may, for example, have an in-plane retardation satisfying Inequality 5c.

$$180 \text{ nm} \leq R_{in2}(450 \text{ nm}) \leq 270 \text{ nm} \qquad \text{<Inequality 5c>}$$

The lower phase difference layer 450 satisfying Inequality 2 may, for example, have a thickness direction retardation satisfying Inequality 6.

$$-60 \text{ nm} \leq R_{th2}(450 \text{ nm}) \leq 65 \text{ nm} \qquad \text{<Inequality 6>}$$

In Inequality 6, $R_{th2}$(450 nm) denotes a thickness direction retardation of the lower phase difference layer at a wavelength of 450 nm.

The lower phase difference layer 450 may, for example, have a thickness direction retardation satisfying Inequality 6a.

$$-50 \text{ nm} \leq R_{th2}(450 \text{ nm}) \leq 50 \text{ nm} \qquad \text{<Inequality 6a>}$$

The lower phase difference layer 450 may, for example, have a thickness direction retardation satisfying Inequality 6b.

$$-40 \text{ nm} \leq R_{th2}(450 \text{ nm}) \leq 40 \text{ nm} \qquad \text{<Inequality 6b>}$$

The lower phase difference layer 450 may, for example, have retardation satisfying Inequality 7.

$$-0.25 \leq R_{th2}(450 \text{ nm})/R_{in2}(450 \text{ nm}) \leq 0.25 \qquad \text{<Inequality 7>}$$

The lower phase difference layer 450 may, for example, have retardation satisfying Inequality 7a.

$-0.22 \leq R_{th2}(450 \text{ nm})/R_{in2}(450 \text{ nm}) \leq 0.22$ <Inequality 7a>

The lower phase difference layer 450 may, for example, have retardation satisfying Inequality 7b.

$-0.20 \leq R_{th2}(450 \text{ nm})/R_{in2}(450 \text{ nm}) \leq 0.20$ Inequality 7b The lower phase difference layer 450 may, for example, have retardation satisfying Inequality 7c.

$-0.15 \leq R_{th2}(450 \text{ nm})/R_{in2}(450 \text{ nm}) \leq 0.15$ <Inequality 7c>

The lower phase difference layer 450 may, for example, have retardation satisfying Inequality 7d.

$-0.10 \leq R_{th2}(450 \text{ nm})/R_{in2}(450 \text{ nm}) \leq 0.10$ <Inequality 7d>

The lower phase difference layer 450 may, for example, have retardation satisfying Inequality 7e.

$-0.05 \leq R_{th2}(450 \text{ nm})/R_{in2}(450 \text{ nm}) \leq 0.05$ <Inequality 7e>

According to the embodiment, the LCD displays a color by using a color conversion layer including a light emitting element, and thus may increase photo-efficiency and improve color characteristics.

In addition, light characteristics and viewing angle characteristics of the color conversion layer including a light emitting element may be secured, and thus display characteristics may be improved by introducing the upper polarizing layer and the upper phase difference layer inside the LCD panel 300 but omitting a polarizer and a phase difference film outside an upper substrate to prevent deterioration of the light characteristics and the color characteristics by the polarizer and the phase difference film disposed outside the upper substrate.

In addition, the upper polarizing layer and the upper phase difference layer are provided to be thin and thus may realize a thin LCD.

In addition, the phase difference layer having the refractive index of Inequality 1 and the phase difference layer having the refractive index of Inequality 2 may be combined to adjust an overall retardation and thus to reduce or prevent a light leakage at the side before light reaches a color conversion layer in a black mode, and accordingly, to reduce unnecessary light emission of the color conversion layer in the black mode, thus decrease black luminance, and resultantly, improve a contrast ratio.

In an embodiment, the upper phase difference layer having the refractive index of Inequality 1 and the lower phase difference layer having the refractive indexes of Inequality 2 are exemplarily illustrated but not limited thereto, and the lower phase difference layer having the refractive index of Inequality 1 and the upper phase difference layer having the refractive index of Inequality 2 may be combined, for example.

Hereinafter, the embodiments are illustrated in more detail with reference to examples. However, these examples are exemplary, and the present disclosure is not limited thereto.

<Optical Simulation>

An LCD is manufactured to have the following structure, and an optical simulation is performed.

The optical simulation is performed by using a Techwiz program (Sanayi System Co., Ltd.) to obtain a black luminance distribution at a wavelength of 450 nm and at an azimuthal angle of about 0° to about 360° and a tilt angle of about 0° to about 90° and calculate its average.

Examples 1 to 54

An optical simulation about an LCD including an upper substrate (glass); an upper polarizing layer; an upper phase difference layer; a homeotropic liquid crystal layer; a lower substrate (glass); a lower phase difference layer; a lower polarizing layer; and a blue light source disposed in order from the examiner is performed. Input variables of each layer are as follows:

Refractive indexes of the upper and lower substrates (glass): 1.5,

Thicknesses of the upper and lower substrates (glass): 500 μm,

Transmittance of the upper and lower polarizing layers: 42.45%,

Degrees of polarization of the upper and lower polarizing layers: 99.99%,

Refractive indexes ne and no of the vertical alignment liquid crystal layer: ne=1.6163 and no=1.4956, Average refractive index of the upper phase difference layer: 1.60, nx-nz of the upper phase difference layer: 0.052, Average refractive index of the lower phase difference layer: 1.65, nx-nz of the lower phase difference layer: 0.0026, Blue light source: 450 nm short wavelength light source The optical simulation is performed at various ranges satisfying the following optical conditions.

Vertical alignment liquid crystal layer: $R_{th}$=−295 nm,

Upper phase difference layer: $n_{x1} \geq n_{y1} > n_{z1}$, $R_{in1}$=0 nm-20 nm, $R_{th1}$=230 nm to 370 nm, and Lower phase difference layer: $n_{x2} > n_{z2} > n_{y2}$, $R_{in2}$=110 nm to 330 nm, $R_{th2}$=−60 nm to 65 nm Comparative Example 1

An optical simulation about an LCD having the same structure as Examples except for including neither the upper phase difference layer nor the lower phase difference layer is performed.

Comparative Example 2

An optical simulation about an LCD having the same structure as Examples except for not including the upper phase difference layer is performed.

Comparative Example 3

An optical simulation about an LCD having the same structure as Examples except for not including the lower phase difference layer is performed.

Comparative Example 4

An optical simulation about an LCD having the same structure as Examples except for not including the upper phase difference layer and changing an optical condition of the lower phase difference layer as follows is performed.

Lower phase difference layer: $n_{x2} \neq n_{y2} > n_{z2}$, $R_{in2}$=65 nm, $R_{th2}$=250 nm <Evaluation>

The optical simulation results are shown as a black luminance distribution and an average black luminance at a wavelength of 450 nm at an azimuth ranging from 0° to 360° and a tilt angle ranging from 0° to 90°.

A sum of the black luminances at all the azimuths and tilt angles tends to be proportional to a dose of light reaching a color conversion layer, and accordingly, as the sum of the black luminances is smaller, the dose of light emitted by the color conversion layer is decreased, and thus the black luminance becomes lower. Accordingly, as the black luminance is lower, an LCD is expected to have the higher contrast ratio.

An average black luminance may be obtained by averaging all the black luminances at all the azimuths and all the tilt angles. As the average black luminance is lower, an LCD is expected to have the higher contrast ratio.

Table 1 shows average black luminances of the LCDs according to Examples and Comparative Examples, and FIGS. 2 to 11 show a black luminance distribution of the LCDs according to Examples 3, 9, 16, 44, 49, and 54 and Comparative Examples 1 to 4.

Figure 2:
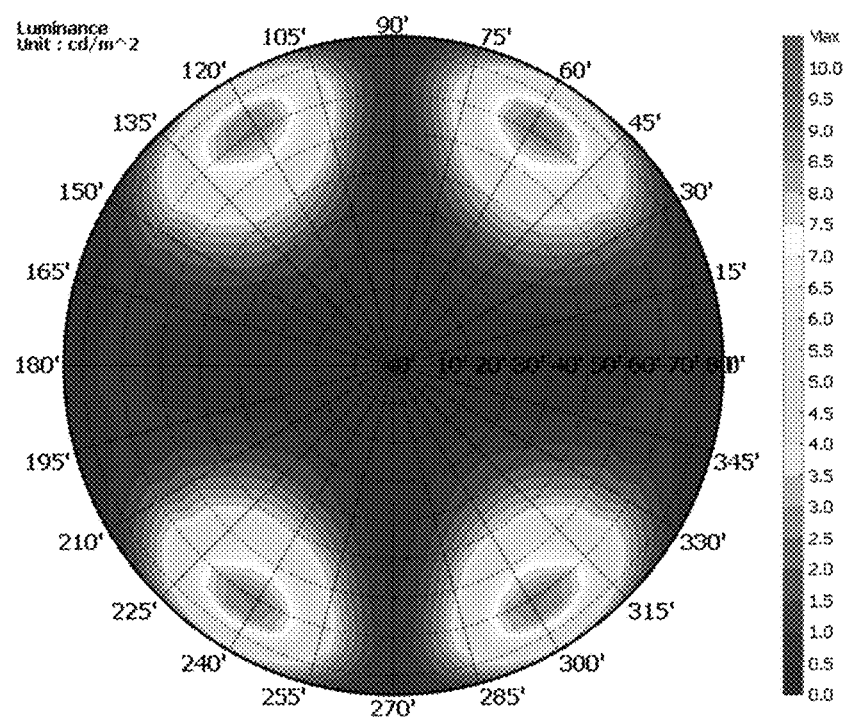
FIG. 2 is a diagram showing a distribution of black luminance of the LCDs according to Example 3.
Figure 3:
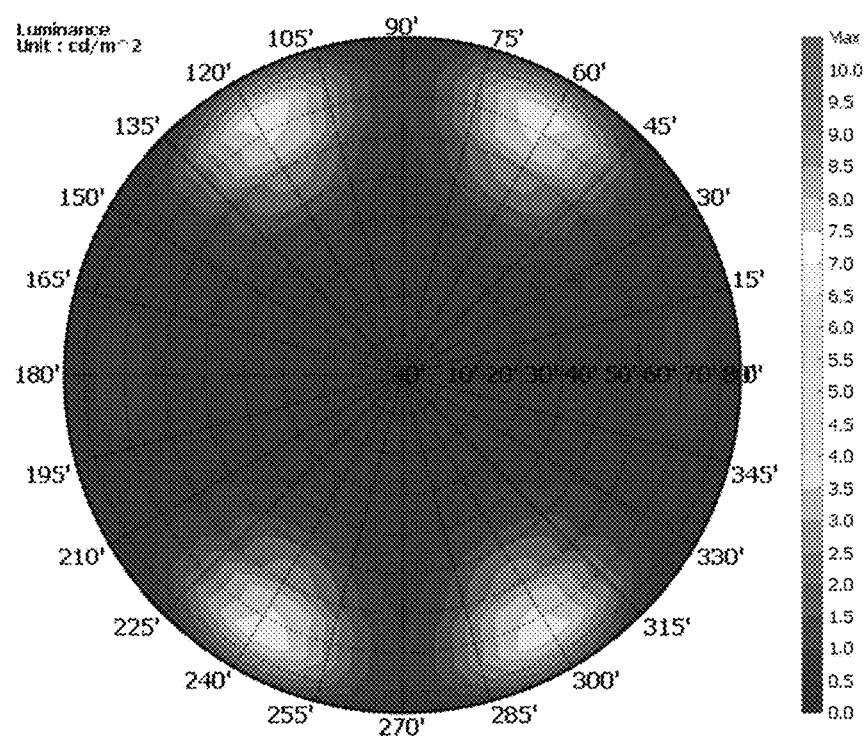
FIG. 3 is a diagram showing a distribution of black luminance of the LCDs according to Example 9.
Figure 4:
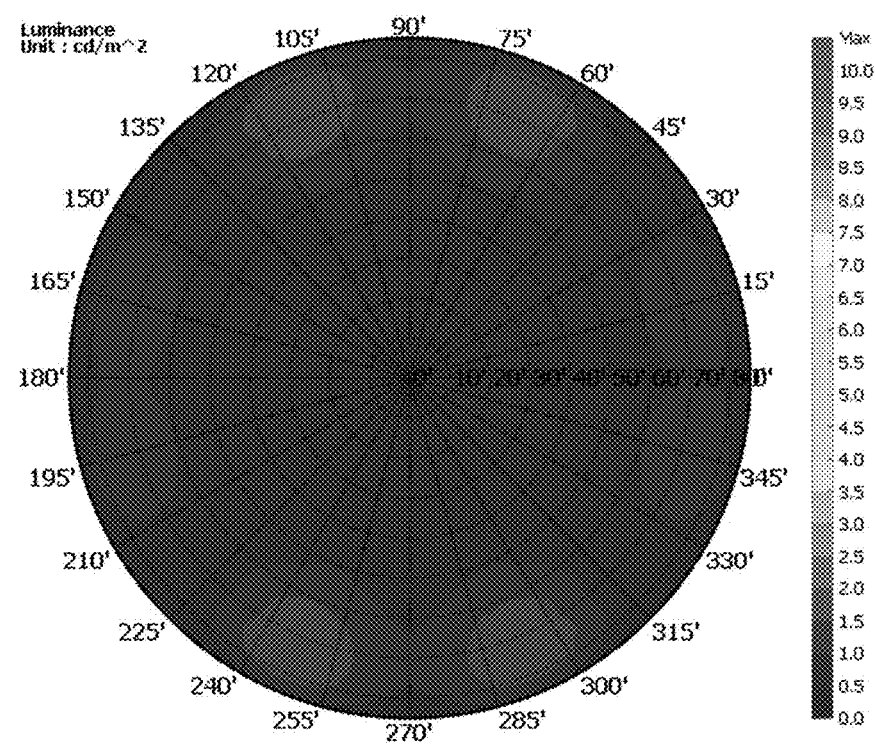
FIG. 4 is a diagram showing a distribution of black luminance of the LCDs according to Example 16.
Figure 5:
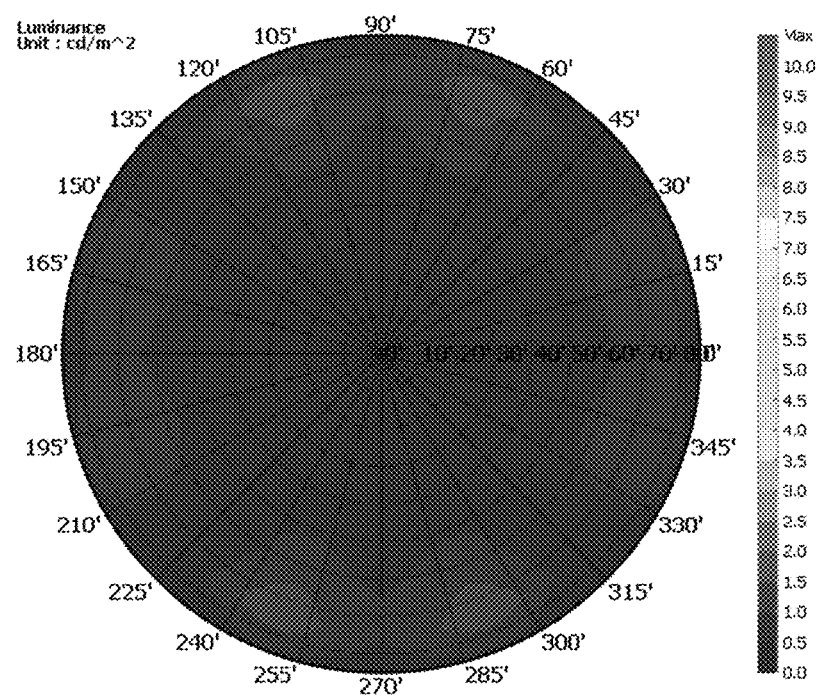
FIG. 5 is a diagram showing a distribution of black luminance of the LCDs according to Example 44.
Figure 6:
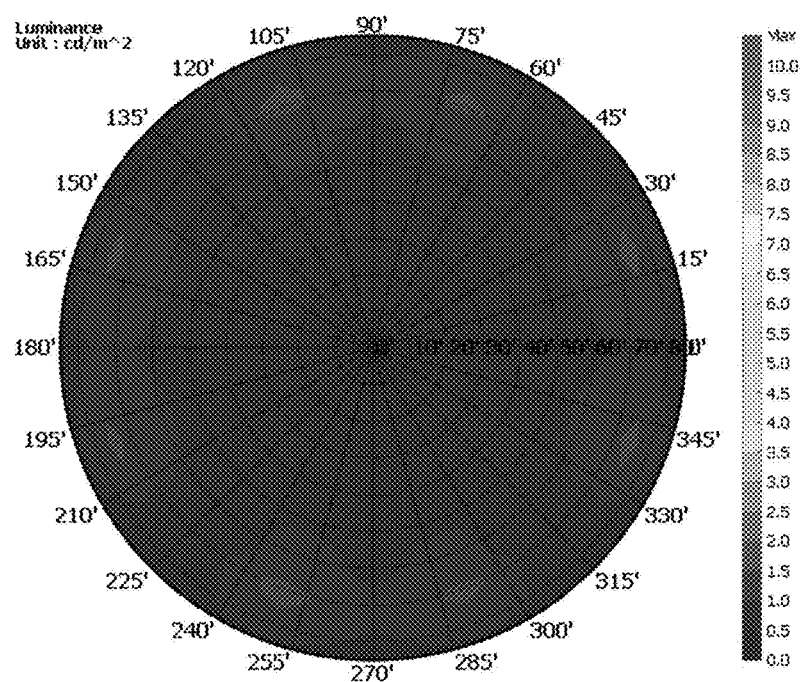
FIG. 6 is a diagram showing a distribution of black luminance of the LCDs according to Example 49.
Figure 7:
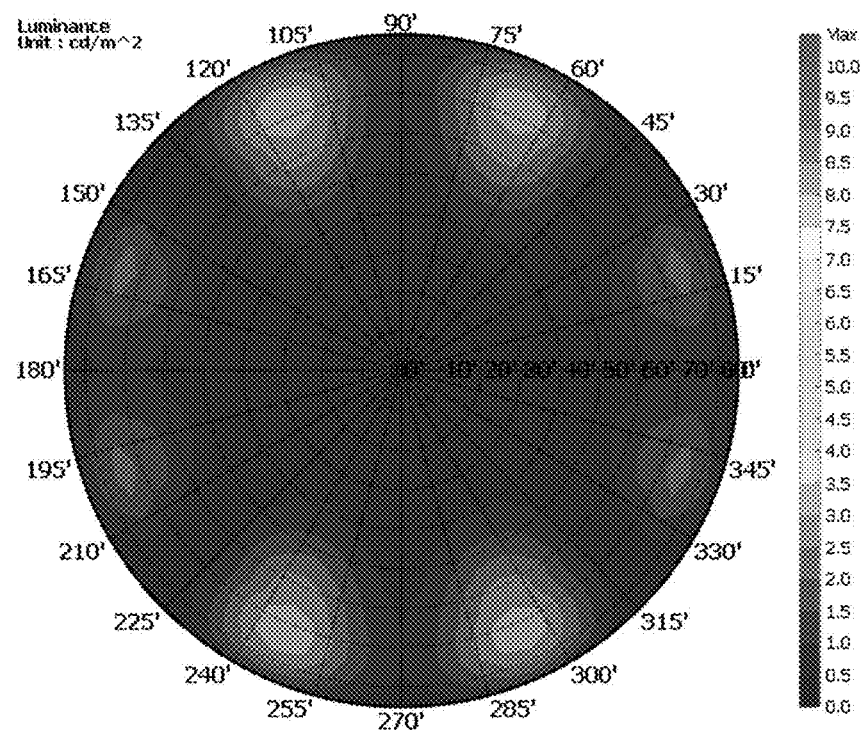
FIG. 7 is a diagram showing a distribution of black luminance of the LCDs according to Example 54.
Figure 8:
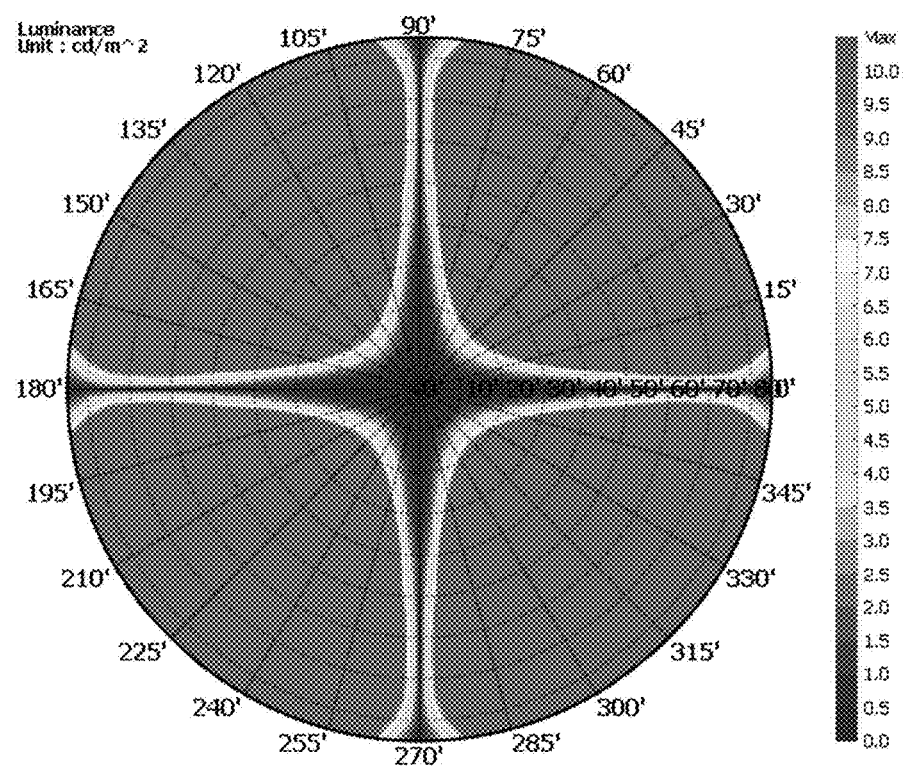
FIG. 8 is a diagram showing a distribution of black luminance of the LCDs according to Comparative Example 1.
Figure 9:
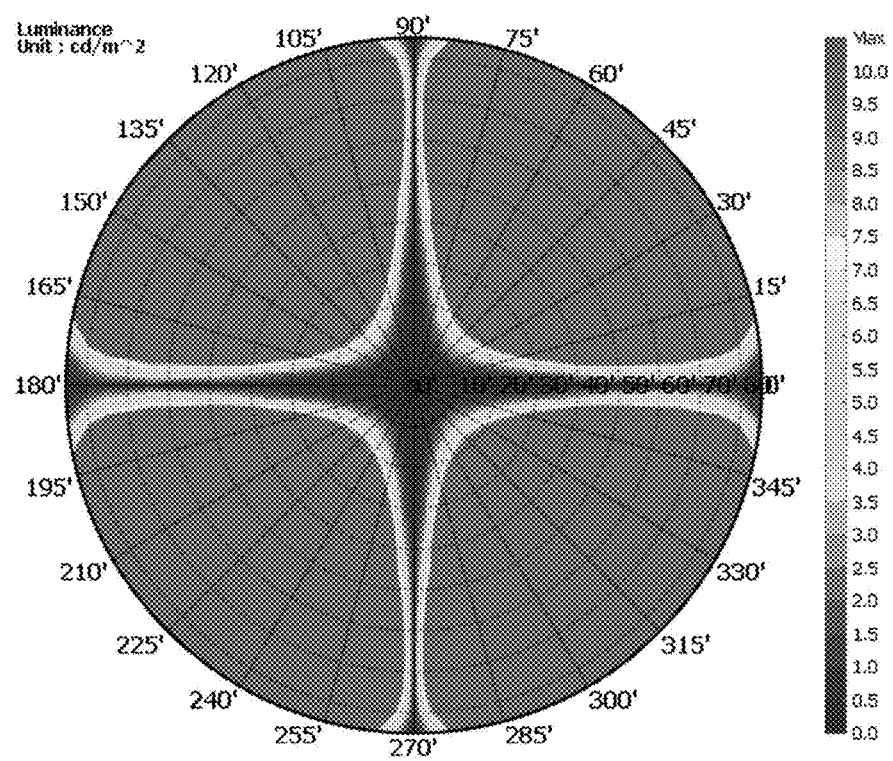
FIG. 9 is a diagram showing a distribution of black luminance of the LCDs according to Comparative Example 2.
Figure 10:
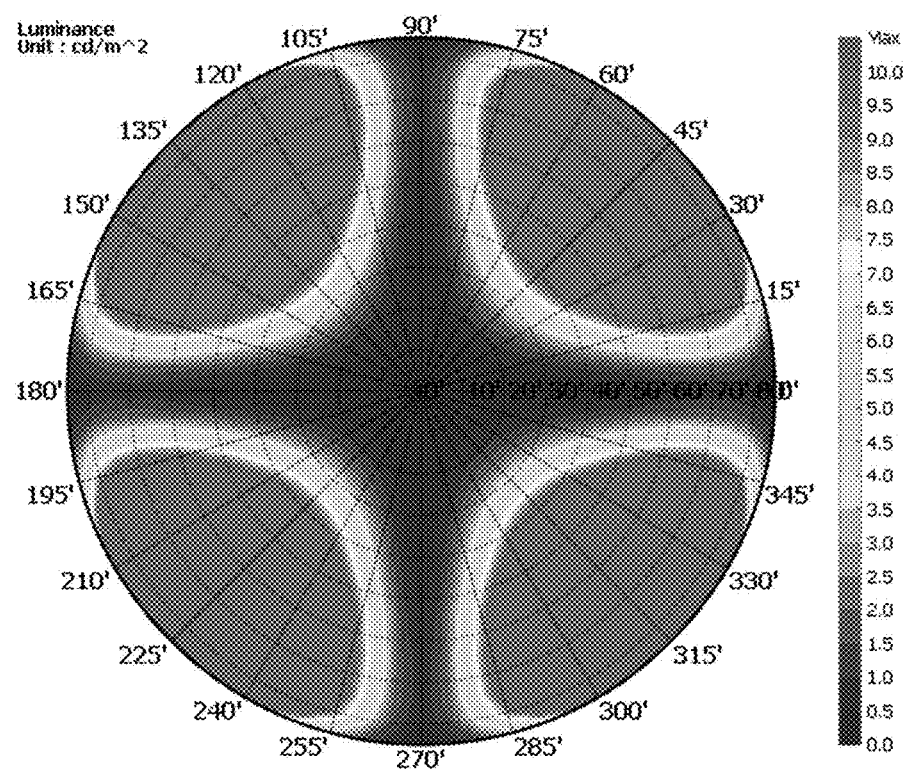
FIG. 10 is a diagram showing a distribution of black luminance of the LCDs according to Comparative Example 3.
Figure 11:
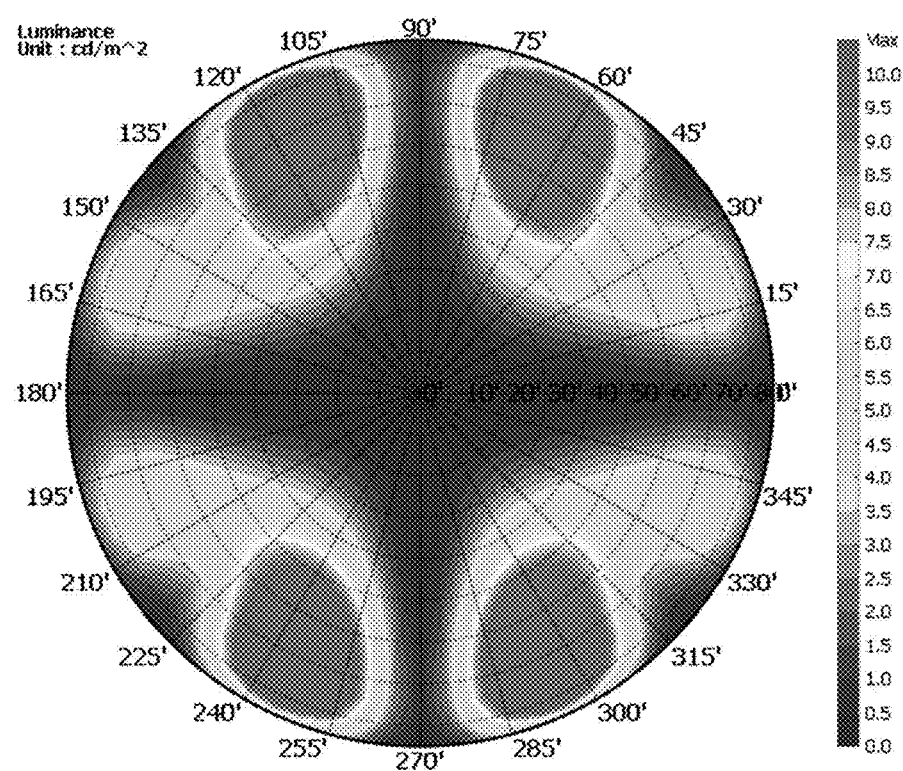
FIG. 11 is a diagram showing a distribution of black luminance of the LCDs according to Comparative Example 4.

FIG. 2 is a diagram showing a black luminance distribution of the LCDs according to Example 3, FIG. 3 is a diagram showing a black luminance distribution of the LCDs according to Example 9, FIG. 4 is a diagram showing a black luminance distribution of the LCDs according to Example 16, FIG. 5 is a diagram showing a black luminance distribution of the LCDs according to Example 44, FIG. 6 is a diagram showing a black luminance distribution of the LCDs according to Example 49, FIG. 7 is a diagram showing a black luminance distribution of the LCDs according to Example 54, FIG. 8 is a diagram showing a black luminance distribution of the LCDs according to Comparative Example 1, FIG. 9 is a diagram showing a black luminance distribution of the LCDs according to Comparative Example 2, FIG. 10 is a diagram showing a black luminance distribution of the LCDs according to Comparative Example 3, and FIG. 11 is a diagram showing a black luminance distribution of the LCDs according to Comparative Example 4.

TABLE 1

| | Upper phase difference layer | | Lower phase difference layer | | | Average black luminance (cd/m²) | Percentage (%) relative to Comparative Example 4 |
|---|---|---|---|---|---|---|---|
| | $R_{in1}$ (nm) | $R_{th1}$ (nm) | $R_{in2}$ (nm) | $R_{th2}$ (nm) | $R_{th2}/R_{in2}$ | | |
| Comparative Example 1 | — | — | — | — | — | 101.392 | 3111% |
| Comparative Example 2 | — | — | 230 | 0 | 0.00 | 94.681 | 2905% |
| Comparative Example 3 | 0 | 300 | — | — | — | 9.054 | 278% |
| Comparative Example 4 | — | — | 65 | 250 | 3.85 | 3.259 | 100% |
| Example 1 | 0 | 240 | 120 | 0 | 0.00 | 2.417 | 74% |
| Example 2 | 0 | 240 | 140 | 0 | 0.00 | 1.662 | 51% |
| Example 3 | 0 | 240 | 160 | 0 | 0.00 | 1.471 | 45% |
| Example 4 | 0 | 240 | 180 | 0 | 0.00 | 1.867 | 57% |
| Example 5 | 0 | 240 | 200 | 0 | 0.00 | 2.808 | 86% |
| Example 6 | 0 | 260 | 120 | 0 | 0.00 | 2.062 | 63% |
| Example 7 | 0 | 260 | 140 | 0 | 0.00 | 1.154 | 35% |
| Example 8 | 0 | 260 | 160 | 0 | 0.00 | 0.662 | 20% |
| Example 9 | 0 | 260 | 180 | 0 | 0.00 | 0.625 | 19% |
| Example 10 | 0 | 260 | 200 | 0 | 0.00 | 1.044 | 32% |
| Example 11 | 0 | 260 | 220 | 0 | 0.00 | 1.889 | 58% |
| Example 12 | 0 | 280 | 120 | 0 | 0.00 | 2.733 | 84% |
| Example 13 | 0 | 280 | 140 | 0 | 0.00 | 1.681 | 52% |
| Example 14 | 0 | 280 | 160 | 0 | 0.00 | 0.894 | 27% |
| Example 15 | 0 | 280 | 180 | 0 | 0.00 | 0.429 | 13% |
| Example 16 | 0 | 280 | 200 | 0 | 0.00 | 0.328 | 10% |
| Example 17 | 0 | 280 | 220 | 0 | 0.00 | 0.595 | 18% |
| Example 18 | 0 | 280 | 240 | 0 | 0.00 | 1.212 | 37% |
| Example 19 | 0 | 280 | 260 | 0 | 0.00 | 2.130 | 65% |
| Example 20 | 0 | 300 | 160 | 0 | 0.00 | 2.197 | 67% |
| Example 21 | 0 | 300 | 180 | 0 | 0.00 | 1.287 | 40% |
| Example 22 | 0 | 300 | 200 | 0 | 0.00 | 0.652 | 20% |
| Example 23 | 0 | 300 | 220 | 0 | 0.00 | 0.334 | 10% |
| Example 24 | 0 | 300 | 240 | 0 | 0.00 | 0.359 | 11% |
| Example 25 | 0 | 300 | 260 | 0 | 0.00 | 0.726 | 22% |
| Example 26 | 0 | 300 | 280 | 0 | 0.00 | 1.408 | 43% |
| Example 27 | 0 | 300 | 300 | 0 | 0.00 | 2.344 | 72% |
| Example 28 | 0 | 320 | 200 | 0 | 0.00 | 2.020 | 62% |
| Example 29 | 0 | 320 | 220 | 0 | 0.00 | 1.116 | 34% |
| Example 30 | 0 | 320 | 240 | 0 | 0.00 | 0.545 | 17% |
| Example 31 | 0 | 320 | 260 | 0 | 0.00 | 0.356 | 11% |
| Example 32 | 0 | 320 | 280 | 0 | 0.00 | 0.562 | 17% |
| Example 33 | 0 | 320 | 300 | 0 | 0.00 | 1.146 | 35% |
| Example 34 | 0 | 320 | 320 | 0 | 0.00 | 2.072 | 64% |
| Example 35 | 0 | 340 | 240 | 0 | 0.00 | 1.784 | 55% |
| Example 36 | 0 | 340 | 260 | 0 | 0.00 | 1.043 | 32% |
| Example 37 | 0 | 340 | 280 | 0 | 0.00 | 0.769 | 24% |
| Example 38 | 0 | 340 | 300 | 0 | 0.00 | 0.996 | 31% |
| Example 39 | 0 | 340 | 320 | 0 | 0.00 | 1.708 | 52% |
| Example 40 | 0 | 360 | 260 | 0 | 0.00 | 2.744 | 84% |
| Example 41 | 0 | 360 | 280 | 0 | 0.00 | 2.028 | 62% |
| Example 42 | 0 | 360 | 300 | 0 | 0.00 | 1.929 | 59% |
| Example 43 | 0 | 360 | 320 | 0 | 0.00 | 2.453 | 75% |
| Example 44 | 0 | 250 | 150 | 25 | 0.17 | 0.314 | 10% |
| Example 45 | 0 | 275 | 190 | 7.5 | 0.04 | 0.311 | 10% |
| Example 46 | 0 | 300 | 230 | −50 | −0.22 | 1.772 | 54% |
| Example 47 | 0 | 300 | 230 | −30 | −0.13 | 0.843 | 26% |
| Example 48 | 0 | 300 | 230 | −10 | −0.04 | 0.368 | 11% |
| Example 49 | 0 | 300 | 230 | 0 | 0.00 | 0.303 | 9% |
| Example 50 | 0 | 300 | 230 | 10 | 0.04 | 0.357 | 11% |
| Example 51 | 0 | 300 | 230 | 30 | 0.13 | 0.819 | 25% |
| Example 52 | 0 | 300 | 230 | 50 | 0.22 | 1.751 | 54% |
| Example 53 | 0 | 325 | 270 | 20 | 0.07 | 0.319 | 10% |
| Example 54 | 0 | 350 | 295 | 50 | 0.17 | 0.529 | 16% |

Referring to Table 1 and FIGS. 2 to 11, the LCDs according to Examples maintain a low black luminance at all the azimuths and tilt angles and in addition, a low average black luminance compared with the LCDs according to Comparative Examples 1 to 4. Accordingly, the LCDs according to Examples show an improved contrast ratio compared with the LCDs according to Comparative Examples 1 to 4.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display, comprising:
a lower substrate and an upper substrate facing each other,
a liquid crystal layer between the lower substrate and the upper substrate,
a color conversion layer on the liquid crystal layer,
a first polarizing layer and a first phase difference layer between the liquid crystal layer and the color conversion layer, and
a second polarizing layer and a second phase difference layer between a light source and the lower substrate,
wherein the first phase difference layer has a refractive index satisfying Inequality 1 and
the second phase difference layer has refractive indexes satisfying Inequality 2:

$$nx1 \geq ny1 > nz1 \qquad \text{<Inequality 1>}$$

wherein, in Inequality 1,
nx1 denotes a refractive index at a slow axis of the first phase difference layer,
ny1 denotes a refractive index at a fast axis of the first phase difference layer, and
nz1 denotes a refractive index of the first phase difference layer in a direction perpendicular to the slow axis and the fast axis thereof, $$nx2>nz2>ny2 \qquad \text{<Inequality 2>}$$

wherein, in Inequality 2,
nx2 denotes a refractive index at a slow axis of the second phase difference layer,
ny2 denotes a refractive index at a fast axis of the second phase difference layer, and
nz2 denotes a refractive index of the second phase difference layer in a direction perpendicular to the slow axis and the fast axis thereof.

2. The liquid crystal display of claim 1, wherein the first phase difference layer has a retardation satisfying Inequality 3:

$$230 \text{ nm} \leq Rth1(450 \text{ nm}) \leq 370 \text{ nm} \qquad \text{<Inequality 3>}$$

wherein, in Inequality 3,
Rth1(450 nm) denotes a thickness direction retardation of the first phase difference layer at a wavelength of 450 nanometers.

3. The liquid crystal display of claim 2, wherein the first phase difference layer has a retardation satisfying Inequality 4:

$$0 \text{ nm} \leq R_{in1}(450 \text{ nm}) \leq 20 \text{ nm} \qquad \text{<Inequality 4>}$$

wherein, in Inequality 4,
Rin1(450 nm) denotes an in-plane retardation of the first phase difference layer at the wavelength of 450 nanometers.

4. The liquid crystal display of claim 1, wherein the second phase difference layer has a retardation satisfying Inequality 5:

$$110 \text{ nm} \leq Rin2(450 \text{ nm}) \leq 330 \text{ nm} \qquad \text{<Inequality 5>}$$

wherein, in Inequality 5,
Rin2(450 nm) denotes an in-plane retardation of the second phase difference layer at a wavelength of 450 nanometers.

5. The liquid crystal display of claim 4, wherein the second phase difference layer has a retardation satisfying Inequality 6:

$$-60 \text{ nm} \leq Rth2(450 \text{ nm}) \leq 65 \text{ nm} \qquad \text{<Inequality 6>}$$

wherein, in Inequality 6,
Rth2(450 nm) denotes a thickness direction retardation of the second phase difference layer at the wavelength of 450 nanometers.

6. The liquid crystal display of claim 1, wherein the second phase difference layer has a retardation satisfying Inequality 7:

$$-0.25 \leq Rth2(450 \text{ nm})/Rin2(450 \text{ nm}) \leq 0.25 \qquad \text{<Inequality 7>}$$

wherein, in Inequality 7,
Rin2(450 nm) denotes an in-plane retardation of the second phase difference layer at a wavelength of 450 nanometers, and
Rth2(450 nm) denotes a thickness direction retardation of the second phase difference layer at the wavelength of 450 nanometers.

7. The liquid crystal display of claim 1, wherein the first phase difference layer is disposed between the liquid crystal layer and the first polarizing layer.

8. The liquid crystal display of claim 1, wherein the second phase difference layer is disposed between the second polarizing layer and the lower substrate.

9. The liquid crystal display of claim 1, wherein the color conversion layer includes a light emitting element which receives a first visible light from the light source and emits a second visible light.

10. The liquid crystal display of claim 9, wherein the first visible light is blue light and
the second visible light is one of blue light, green light, red light, and a combination thereof.

11. The liquid crystal display of claim 9, wherein the light emitting element includes at least one of a quantum dot and a phosphor.

12. The liquid crystal display of claim 1, wherein the liquid crystal layer has negative dielectric anisotropy.

13. The liquid crystal display of claim 1, wherein the thickness direction retardation of the liquid crystal layer satisfies $-360 \text{ nm} \leq Rth,cell \leq -250 \text{ nm}$.

14. A liquid crystal display comprising
a first phase difference layer and a second phase difference layer, and
a liquid crystal display panel including a lower substrate and an upper substrate facing each other and a liquid crystal layer between the lower substrate and the upper substrate,
wherein one of the first phase difference layer and the second phase difference layer is disposed between the liquid crystal layer and the upper substrate, and
a remaining one of the first phase difference layer and the second phase difference layer is disposed at a location other than between the lower substrate and the upper substrate,
the first phase difference layer has a refractive index satisfying Inequality 1, and
the second phase difference layer has refractive indexes satisfying Inequality 2:

$$nx1 \geq ny1 > nz1 \qquad \text{<Inequality 1>}$$

wherein, in Inequality 1,
nx1 denotes a refractive index at a slow axis of the first phase difference layer,
ny1 denotes a refractive index at a fast axis of the first phase difference layer, and
nz1 denotes a refractive index of the first phase difference layer in a direction perpendicular to the slow axis and the fast axis thereof, $$nx2>nz2>ny2 \qquad \text{<Inequality 2>}$$

wherein, in Inequality 2,
nx2 denotes a refractive index at a slow axis of the second phase difference layer,
ny2 denotes a refractive index at a fast axis of the second phase difference layer, and
nz2 denotes a refractive index of the second phase difference layer in a direction perpendicular to the slow axis and the fast axis thereof.

15. The liquid crystal display of claim 14, wherein the first phase difference layer has a retardation satisfying Inequality 3 and the second phase difference layer has a retardation satisfying Inequality 5:

$$230 \text{ nm} \leq Rth1(450 \text{ nm}) \leq 370 \text{ nm} \qquad \text{<Inequality 3>}$$

$$110 \text{ nm} \leq Rin2(450 \text{ nm}) \leq 330 \text{ nm} \qquad \text{<Inequality 5>}$$

wherein, in Inequality 3 or 5,
Rth1(450 nm) denotes a thickness direction retardation of the first phase difference layer at a wavelength of 450 nanometers, and
Rin2(450 nm) denotes an in-plane retardation of the second phase difference layer at the wavelength of 450 nanometers.

16. The liquid crystal display of claim 14, wherein the second phase difference layer has a retardation satisfying Inequality 7:

$$-0.25 \leq Rth2(450 \text{ nm})/Rin2(450 \text{ nm}) \leq 0.25 \qquad \text{<Inequality 7>}$$

wherein, in Inequality 7,
Rin2(450 nm) denotes an in-plane retardation of the second phase difference layer at a wavelength of 450 nanometers, and
Rth2(450 nm) denotes a thickness direction retardation of the second phase difference layer at the wavelength of 450 nanometers.

17. The liquid crystal display of claim 14, wherein the liquid crystal display panel further comprises
a color conversion layer on the liquid crystal layer and including a light emitting element.

18. The liquid crystal display of claim 17, wherein the first phase difference layer is under the color conversion layer in the liquid crystal display panel.

19. The liquid crystal display of claim 18, further comprising a first polarizing layer between the first phase difference layer and the color conversion layer.

20. The liquid crystal display of claim 19, wherein the second phase difference layer is disposed outside the liquid crystal display panel which is the location other than between the lower substrate and the upper substrate, and
the liquid crystal display further includes a second polarizing layer on the second phase difference layer.

* * * * *